United States Patent
Balaji et al.

(10) Patent No.: US 7,028,276 B2
(45) Date of Patent: Apr. 11, 2006

(54) FIRST TIME SILICON AND PROTO TEST CELL NOTIFICATION

(75) Inventors: Ekambaram Balaji, Portland, OR (US); Cristian T. Crisan, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 259 days.

(21) Appl. No.: 10/659,138

(22) Filed: Sep. 10, 2003

(65) Prior Publication Data

US 2005/0055649 A1   Mar. 10, 2005

(51) Int. Cl.
*G06F 17/50* (2006.01)
(52) U.S. Cl. .............................. 716/4; 716/5
(58) Field of Classification Search .............. 716/4, 716/5; 709/203
See application file for complete search history.

(56) References Cited

U.S. PATENT DOCUMENTS

| | | | | |
|---|---|---|---|---|
| 5,050,091 A | * | 9/1991 | Rubin | 716/10 |
| 6,055,366 A | * | 4/2000 | Le et al. | 716/1 |
| 6,643,683 B1 | * | 11/2003 | Drumm et al. | 709/203 |
| 6,668,360 B1 | * | 12/2003 | Liu | 716/4 |
| 2003/0084418 A1 | * | 5/2003 | Regan | 716/14 |

* cited by examiner

*Primary Examiner*—Sun James Lin
(74) *Attorney, Agent, or Firm*—Christopher P. Maiorana, P.C.

(57) ABSTRACT

A method for notification of a first new cell is disclosed. The method generally includes the steps of (A) generating a first report for a circuit design comprising a plurality of first cells including the first new cell by executing a rule check on the circuit design, (B) comparing the first report with a database comprising a plurality of second cells already manufactured and (C) notifying a client of the first new cell in response to the first new cell not matching any of the second cells.

19 Claims, 2 Drawing Sheets

170

172
ON THE CLIENT SIDE, THE DESIGNER RUNS DESIGN RULES CHECKS WHICH GENERATES A NEW CELLS REPORT IN THE DESIGN DIRECTORY

174
AT FINAL DESIGN STAGE (DNE) THE NEW CELLS REPORT IS TRANSFERED TO THE INBOX ON THE SERVER SIDE

176
SERVER SIDE INBOX PROCESSING SCRIPT COMPARES THE LIST OF NEW CELLS IN THE REPORT AGAINST ANY EXISTING DATABASE REPORTS. NEW CELLS FOR DESIGNS NOT ALREADY PRESENT IN THE DATABASE ARE ADDED TO THE DATABASE, AND AN E-MAIL REPORT IS SENT TO THE TEST ENGINEER

178
TEST ENGINEER LOGS INTO WEB INTERFACE AND SEARCHES FOR NEW CELLS OF A PARTICULAR DESIGN. IF THE DESIGN WAS NOT MANUFACTURED, THE TEST ENGINEER DELETES THE CELL FROM THE DATABASE. IF THE DESIGN HAS GONE THROUGH MANUFACTURING, THE STATUS OF THE CELLS IS CHANGED TO MANUFACTURING COMPLETE (USED)

FIG. 2

FIRST TIME SILICON AND PROTO TEST CELL NOTIFICATION

FIELD OF THE INVENTION

The present invention relates to a semiconductor design and manufacturing process using electronic design automation tools generally and, more particularly, to first time silicon and proto test cell notification to reduce protohold turn around time.

BACKGROUND OF THE INVENTION

An ongoing challenge for semiconductor suppliers is to reduce the time used to manufacture integrated circuit (IC) prototypes in a very competitive semiconductor industry. Prototypes are commonly used to develop new technologies. The prototypes can represent the first manufactured silicon for a given design. Prototype wafers usually have the highest priority of all the wafers going through the semiconductor manufacturing process at any given time. One of the many steps involved in the prototype manufacturing process involves the testing of the IC after fabrication.

Because prototype wafers often contain leading edge IC library components, test engineers should determine whether a prototype IC failure is due to a manufacturing defect or because of design issues with the library components used in the IC design. One of the ways to reduce the amount of time used to deliver a prototype IC to a customer is to minimize or eliminate the amount of time the prototype wafers spend sitting on hold (protohold). A factor in protohold is that tests for verifying the functionality of the prototype IC are not available or need modifications.

Many issues exist in reducing protohold turn around time (TAT). Test engineers lack a method to acquire advanced knowledge of which library cells, such as standard cells, core cells or memories, are being used for the first time in an IC design to closely monitor the new cells for possible silicon failures. Setting up special testing procedures for the new cells should be completed before the prototype die reach the test floor. Control for when to change the status of a cell from never been manufactured (i.e., new) to manufacturing complete (i.e., old) are commonly missing. No easy method exists for finding out a list of current designs that contain new library components.

Currently, the test engineers contact the design engineers or other test engineers, who in turn talk to other designers and test engineers to find out whether previous designs used the library components in question and whether the design was manufactured successfully. The current methods depend on a response time of designers and test engineers. The current solution is sometimes inaccurate since prior designs could have been implemented in the library component but were never manufactured. In addition, the test engineer cannot change the status of the library components to indicate if the components have been manufactured successfully. Knowing which library components used in the prototype ICs that have never been through the manufacturing flow before and being able to set up new testing procedures before the wafers arrive on the test floor are desirable to help reduce the protohold time.

SUMMARY OF THE INVENTION

The present invention concerns a method for notification of a first new cell. The method generally comprises the steps of (A) generating a first report for a circuit design comprising a plurality of first cells including the first new cell by executing a rule check on the circuit design, (B) comparing the first report with a database comprising a plurality of second cells already manufactured and (C) notifying a client of the first new cell in response to the first new cell not matching any of the second cells.

The objects, features and advantages of the present invention include providing a method and/or system for first time silicon and proto test cell notification that may (i) combine ASCII and e-mail reports with a web interface that is available full time and up-to-date with real time data, (ii) enable designers and test engineers to search a database for design-in-progress (DIP) new cells, (iii) enable test engineers to update the status of the DIP new cells once manufacturing is complete, (iv) automatically send an e-mail notification as soon as a design containing the new cells reaches the final design review stage, (v) provide the test engineers with enough time to prepare special testing procedures for the new cells prior to receiving the prototype wafers on the test floor, (vi) provide a DIP new cell list and a final new cell list to ensure that only cells that have completed successful silicon fabrication are present in a used cell database, (vii) prevent new cells from being archived in the database until completing a manufacturing milestone, (vii) allow for tracking of library elements in parallel if used in multiple designs simultaneously and/or (viii) constantly update the list for the DIP new cells through a design process to ensure only the latest list is transferred to the new cell library after the final design check.

BRIEF DESCRIPTION OF THE DRAWINGS

These and other objects, features and advantages of the present invention will be apparent from the following detailed description and the appended claims and drawings in which:

FIG. 2 is a flow diagram of an example method for operating the system.

DETAILED DESCRIPTION OF THE PREFERRED EMBODIMENTS

Figure 1:
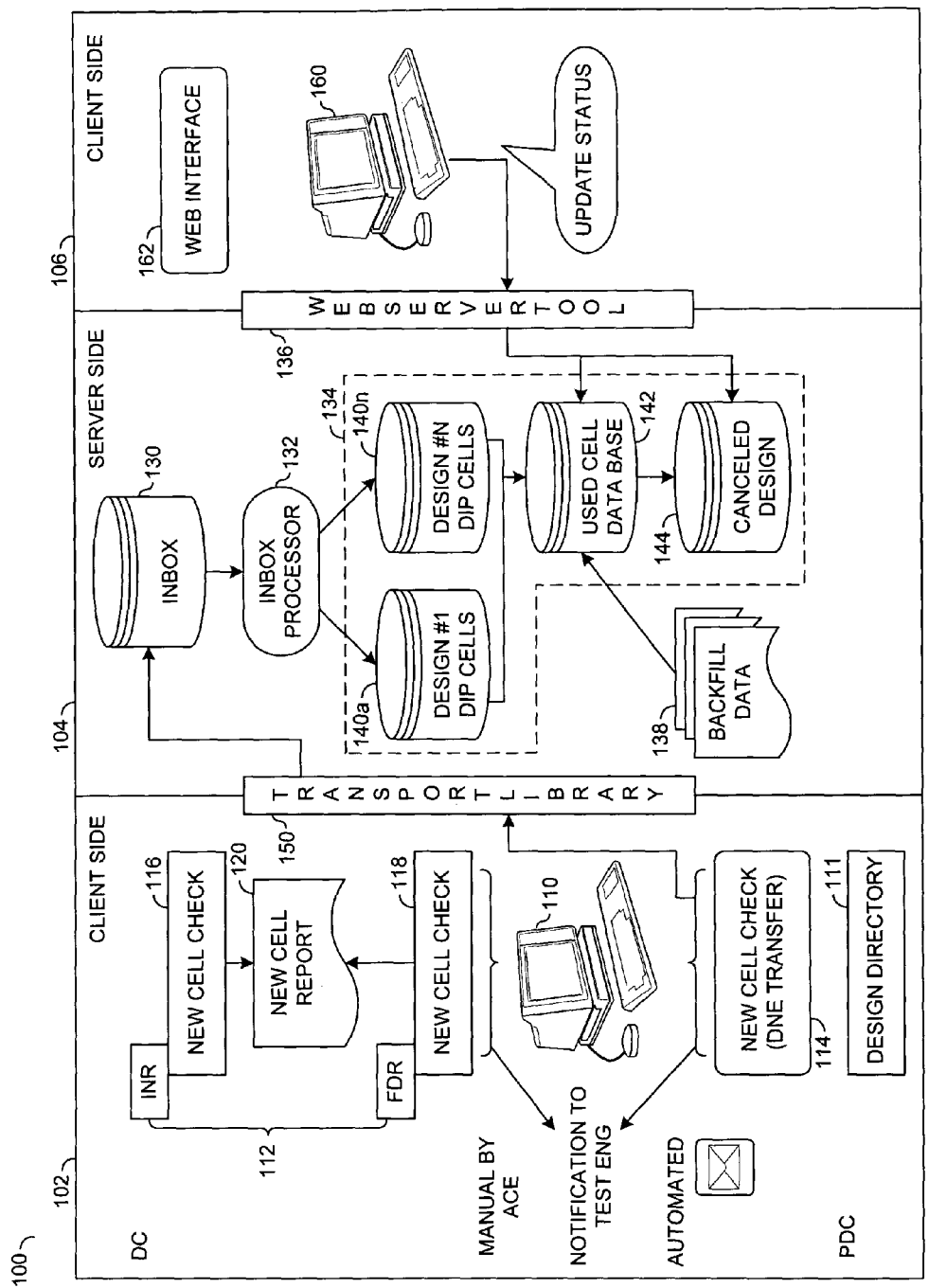
FIG. 1 is a block diagram of a system shown in accordance with a preferred embodiment of the present invention.

The system and methodology of the present invention generally involves the development of an early warning notification to support protohold turn around time (TAT) reduction by detecting use of first time silicon and proto test cells. The present invention generally comprises a software infrastructure and an easy to adopt integration methodology with a web interface. The present invention may be known as a First Time Cell Use (FTCU) system.

The FTCU system generally provides multiple functions in support of reducing the protohold TAT. A mechanism may be provided to detect and report usage of cells that may see silicon for the first time, through ASCII report files in a design directory during initial steps of a design process. First time use cells may include, but are not limited to, input/output, mixed signal, memories, cores and/or megacells cell types. A design rule checker (DRC) and a web interface may work within a company intranet to support design checking (DC) and post design checking (PDC) operations. Connections to an external network may allow the FTCU system to be operated from external distributor sites.

At a final stage of the design process, the FTCU system will generally send an e-mail report to one or more appropriate groups and/or organizations (e.g., clients) that may take any necessary steps to reduce protohold times caused by the new cells. In addition, the FTCU system may also transfer a list of design-in-progress (DIP) cells to a centralized inbox repository. Files are generally moved from the inbox repository to a centralized location only when the list of DIP cells changes to prevent duplicate e-mail notifications from being sent to test engineers and/or other clients.

A web interface may allow designers and/or test engineers to browse the real-time status of the used cells and DIP cells stored in the central depository. A password protected login may be implemented to control who may change the status of DIP cells to used cells. The login may also limit who may delete DIP cells from the centralized repository when individual DIP cells have been abandoned prior to initial fabrication and/or initial testing.

The following terminologies may be used in describing the present invention. A "cell" may refer to any library element such as core cell, input/output cell, memory or the like. A "new cell" generally refers to a cell that has never been used in a design before. The new cell classification may also imply that the new cell is about to be fabricated in silicon for first time. A design-in-progress "DIP cell" generally refers to a cell design before sign-off or final design rule check (DRC), netlist versus layout (NVL) and e-beam (EB) checks (collectively referred to as DNE checks) have been completed. A "new cell library" may be a database that contains a list of new cells for every design that has reached the final DNE check. A "used cell" may refer to a cell that was used in a previous design and was successfully manufactured. A "used cell library" may be a database of unique cells that have been used in a previous design.

Referring to FIG. 1, a block diagram of a system 100 is shown in accordance with a preferred embodiment of the present invention. The system 100 may be implemented as an FTCU system. The FTCU system 100 generally comprises a source client 102, a server 104 and a destination client 106.

The source client 102 generally comprises (i) a workstation 110 operated by a designer and/or an application specific integrated circuit (ASIC) consumer engineer (ACE) (not shown) and (ii) a design directory 111. The workstation 110 may be operational to perform design checks (DC) 112 on circuit designs being developed. The workstation 110 may also be operational to perform post design checks (PDC) 114 on a completed circuit design.

The design checks 112 generally include an initial netlist review (INR) 116 and a final design review (FDR) 118. The INR 116 and/or FDR 118 may generate a report 120 based upon the review. The report 120 may identify each cell of the circuit design reviewed. One or more of the cells in the report 120 may be a new cell that has never been fabricated and tested. As such, the report 120 may be referred to as a new cell report. The PDC 114 generally includes one or more automated tools to check the just completed circuit design. The automated tools may include, but are not limited to DRC tools, NVL tools and EB tools.

The server 104 generally comprises an inbox storage space 130, an inbox processor 132, a database 134, a web server tool 136, and a storage space 138. The server 104 may be implemented as a centralized server. The database 134 generally comprises one or more DIP cell libraries (or databases) 140a–140n, a used cell library (or database) 142 and a canceled design library (or database) 144. The inbox storage space 130 may be linked to the source client 102 through a network 150 such as an intranetwork, an internet, a wide area network, a transport library or the like. The database 134 may be linked to the destination client 106 through the web server tool 136. The inbox processor 132 may be in communication with the inbox storage space 130 to receive e-mails, attachments and other information from the source client 102. The inbox processor 132 may also be in communication with the DIP cell databases 140a–140n. New cell and used cell data stored in the DIP cell databases 140a–140n may be transferrable to the used cell database 142 and the canceled design database 144. The backfill data storage space 138 may be in communication with the user cell database 142 for maintenance and archival purposes.

The destination client 106 generally comprises a workstation 160 operated by a test engineer (not shown). Other types of engineers and personnel may use the workstation 160. The workstation 160 may communicate with the server 104 via a web interface 162 communicating with the web server tool 136. The destination client 106 may communicate with the server 104 across a network. The network may or may not be the same as the network 150. The network may be an intranetwork, an internet, a wide area network or the like.

Referring to FIG. 2, a flow diagram of an example method 170 for operating the FTCU system 100 is shown. The method 170 generally comprises a step (or block) 172, a step (or block) 174, a step (or block) 176 and a step (or block) 178. At all stages of a design flow on the source client 102 side, a gate level design netlist may be analyzed for various cells used and then a design cell list may be created. The design cell list may be compared with the used cell database 142 archived in the server 104. Items in the design cell list not present in used cell database 142 may be classified as DIP new cells and may be captured in the new cell report 120. The new cell report 120 listing the DIP new cells may be created for the designer to review in the design directory 111 (e.g., block 172). The new cell report 120 may be recreated as many times as the DRC tool, DNE tool and/or similar tools are run during a design cycle. Repeated generation of the new cell report 120 will generally ensure that the DIP new cells list within the new cell report 120 is kept up to date as the design progresses. A final DRC run during the DNE stage generally adds the DIP new cells into the inbox storage space 130 of the server 104 (e.g., block 174).

The inbox processor 132 may execute a processing script that compares the list of new cells in the new cell report 120 against any existing database reports stored in the database 134. New cells for circuit designs not already present in the database 134 may be added to a DIP cell database 140a–140n. The inbox processor 132 may also be configured such that a notification of each new cell received in the inbox storage space 130 is only sent to the test engineers at the destination client 106 after the final DNE stage of the design flow (e.g., block 176). A test engineer from the destination client 106 may log into the web interface 162 and search for new cells in the DIP cell databases 140a–140n, used (existing) cells in the used cell database 142 and optionally search for canceled cells in the canceled design database 144. If a particular new cell design has not been manufactured and/or tested, the test engineer may remove the particular new cell from the appropriate DIP cell database 140a–140n by either transferring the particular new cell to the canceled design database 144 of deleting the particular new cell from the database 134. If the particular new cell design has completed manufacturing and/or testing, the test engineer may change the classification or status of the particular new cell to that of a used cell (e.g., block 178).

Upon receipt of a subsequent new cell report in the inbox 130, the inbox processing script executed by the inbox processor 132 generally checks to see if the same cells in the subsequent new cell report already exist as DIP cells for a current design in database 134. If the cell list within the subsequent new cell report is different from, or if the subsequent new cell report is the first list of DIP cells for a given design, the inbox processing script may transfer the list of cells to a DIP list in the database 134. If the same list of cells already exists in the database 134 for the design, the newly submitted file may be ignored and notification to the destination client 106 may be suppressed. The status or classification of the subsequent new cell list may be "design-in-progress" (or "new") and the list may be stored in a DIP portion of the database 134 until the test engineering signs-off the cells for being production worthy silicon.

During the transfer of DIP cells from the inbox 130 to the database 134, the notification is generally sent to a predetermined list of e-mail aliases contains the following information, (i) design name, (ii) login identification of person running the check and (iii) a list of the DIP new cells. An example of how the DIP new cell list may look like in the database 134 is generally illustrated in TABLE I as follows:

TABLE I

| Chip | #Cells | # USED Cells | # NEW Cells | # USED Cell Library List |
|---|---|---|---|---|
| Alpha1 | 100 | 00 used | 100 new | 100 Total |
| Beta2 | 80 | 65 used | 15 new | 115 Total |
| Charlie3 | 200 | 110 used | 90 new | 205 Total |
| Delta4 | 200 | 195 used | 05 new | 210 Total |
| Eagle5 | 500 | 425 used | 75 new | 512 Total |

The database 134 will generally store the DIP new cells on a per design basis in the DIP cell databases 140a–140n. The DIP new cells may be moved to the used cell database 142 after the test engineers check-off the DIP new cells as completing fabrication and/or test. Once the test engineers check-off the DIP new cells of a particular circuit design, the final DIP new cell list may be added to the used cell database (library repository) 142 and the DIP new cell list may be deleted.

The web interface 162 generally provides access to multiple functions of the server 104. The web interface 162 may permit the test engineers to browse the used cell database 142 and the DIP cell databases 140a–140n for any circuit design or portion thereof. The test engineers may update status of the DIP new cells from "new" to "used" through the web interface 162 to indicate that manufacturing has been completed. The web interface 162 may allow the test engineers to find out if a given cell in the DIP cell databases 140a–140n is used by multiple circuit designs (generally possible after the final DNE run).

A sample computer code listing for the inbox processing script that may be responsible for checking all new cell reports 120 submitted to the inbox 130 is provided below. The code may determine if any DIP new cells should be transferred to a DIP cell database 140a–140n.

```
new_cell.awk
For each file entry
while ((getline < temp_index_file) > 0) {
  FS = " "
  curr_file = $1
  curr_line = $0
  new_dip_file = Inbox_dir $1
  ## If the new file fails any of the following checks, skip file:
  ## 1. The technology is lcbg12, gflx or g9 (send e-mail notice)
  ## 2. The login ID of the submitter starts with 6, 11, 12, 14,
  ##    15, 16, 17, 18, 19 or 1x (send e-mail notice)
  ## 3. The login ID and design name do not match (send e-mail
  ##    notice)
  ## 4. A file with the same login ID and same cells was already
  ##    submitted
  if (CheckFile ( )) {
    continue
  )
  ## At this point, all checks for the new file passed, so
  ## transfer all cells to the DIP database and send e-mail
  ## notification to testm@abc.com, gen_eng@abc.com and
  ## gresham-simple-alert@abc.com
  print curr_line >> global_log
  close (global_log)
  line_nr = 0
  FS = ";"
  ## For each line in the design file
  while ((getline < new_dip_file) > 0) {
    line_nr++
    ## Line number 2 contains the HEADER
    if (line_nr == 2) {
      tech_log = DIP_dir_\ tech "/log"
      print $0 >> tech_log
      close (tech_log)
```

Sample computer code listings for the web interface scripts are illustrated below. The web interface scripts generally allow the user to browse the DIP cell databases 140a–140n and the used cell database 142 on a per design and/or per cell basis. The scripts may also allow the test engineer to change the status of new cells from "new" to "used" once manufacturing of the cell is complete.

```
new_cell.cgi
#! /usr/local/bin/perl -U
use strict;
use Cmd;
use CGI;
use locale;
my $currDirectory    = getcwd( );
my $newCellDir       = "/abc/dv/cdct_www/new_cell";
my %listOfTechs      = ( );
my $noOfTechs        = 0;
my %usedDesigns      = ( );
my $noOfUsedDesigns  = 0;
my %dipDesigns       = ( );
my $noOfDipDesigns   = 0;
```

```
my $noOfEntriesStr    = "__ABC__NO__ENTRIES__";
my $allTechs          = ( );
sub fillInfo
{
   chdir($newCellDir);
   opendir(DIR, $newCellDir) || return 1;
   close(DIR);
   my $techFile = $newCellDir. "/techs";
   open (TECHFILE, "<$techFile") || return 2;
   my $entryBegin = 0;
   my $noOfLines = 0;
   my $entryName = "technology";
   while(<TECHFILE>)
   {
      chomp $_;
      if($entryBegin == 0)
      {
         my $newArray = ( );
         $listOfTechs($entryName) = \%newArray;
         my $localRef = $listOfTechs($entryName);
         $localRef->($_) = 1;
         $entryBegin = 1;
         $noOfLines++;
         $noOfTechs++;
         $allTechs($_) = \%newArray;
         $allTechs($_) = 1;
}
runQuery.cgi
#! /usr/local/bin/perl
my $session__id = $$;
$cmd = "mkdir /abc/dv/cdct__www/new__cell/run__dir/run__$session__id";
system($cmd);
$cmd="chmod 777 /abc/dv/cdct__www/new__cell/run__dir/run__$session__id";
system($cmd);
$POST__SCRIPT = "/abc/dv/cdct__www/new__cell/scripts/new__cell.awk";
$Parse__form;
$RESULT__FILE = "/abc/dv/cdct__www/new__cell/run__dir/run" "$session__id
   "/$session__id.htm";
$POST__SCRIPT $session__id > $RESULT__FILE;
# Display the results back to the user
print "<HTML><HEAD>";
print "<base target=\"bottom\">\n";
$resultFile = "http://gresham5.abc.com/grcad/cdct__www/new__cell/
   run__dir/run__" $session__id "/$session__id.htm";
print "<SCRIPT LANGUAGE=\"javascript\">\n";
print "window.open ('$resultFile', 'bottom')\n";
print "</SCRIPT>";
print "</HEAD><BODY></BODY>";
print "<HTML>";
sub Parse__form
{
   if ($ENU('REQUEST__METHOD') eq 'GET') {
      @pairs = split(/&/, $ENU('QUERY__STRING'});
   } elseif ($ENU('REQUEST__METHOD') eq 'POST') {
      read (STDIN, $buffer, $ENU{'CONTENT__LENGTH'});
      @pairs = split(/&/, $buffer);
   } else {
      print "Content-type: text/html\n\n";
      print "<P>Use Post or Get";
   }
   foreach $pair (@pairs) {
      ($key, $value) = split (/=/, $pair);
      $key =~ tr/+/ /;
      $key =~ s/%([a-fA-F0-9\W] [a-fA-F0-9\W])/pack("C", hex($1))/eq;
      $values =~ tr/+/ /;
      $values =~ s/%([a-fA-F0-9\W] [a-fA-F0-9]\W])/pack("C", hex($1))
         /eq;
      $values =~ s/<!--(.|\n)*-->//g;
      if ($formdata($key)) {
         $formdata($key) .= ", $value";
      } else {
         $formdata($key) = $value;
      }
update__status.cgi
#! /usr/local/bin/perl
$PREFIX = "/abc/dv/cdct__www/new__cell/run__dir/run__";
$RUN__SCRIPT = "/abc/dv/cdct__www/new__cell/script/update__status.csh";
select((select(STDOUT), $| = 1) [0]);
select((select(STDERR), $| = 1) [0]);
print "Content-type: text/html\n\n";
```

-continued

```
$Parse_form;
$Error_checking;
$RUN_DIRECTORY = $PREFIX . $formdata(run_dir);
$FORM_OPT = $formdata(Technology) . " " . $formdata(username) .
   " " . $formdata(password) . " " . $formdata(Design);
$commandLine = $RUN_SCRIPT . " " . $RUN_DIRECTORY . " " . $FORM_OPT;
$retCode =system("$commandLine 1>/dev/null 2>&1 &");
if ($retCode != 0) {
   print "<center><P><font color=\"#FF0000\"><big><big> ERROR:
      Update Status FAILED (Aborted) !!!</center></font>";
   print "<br><font color=\"#0000FF\">If this is an old query,
      please generate a new one by clicking the \"Browser\" button.
      Query directories are removed during periodic cleanup. <br>
      If you get this error again, please contact;   <a href=\
      "mailto:ebalaji\@abc.com\">Ekambaram Balaji</a>   or  
      <a href=\"mailto:ccrisan\@abc.com\"> Cristian Crisan</a>";
      print "</BODY><HTML>";
      exit (0)
}
# Display Status Update results back to the user
print "<HTML><HEAD>\n";
$Status_File = "http://gresham5@abc.com/grcad/cdct_www/new_cell/
   run_dir/run_" . $format(run_dir) . "/status_udpate.html";
print "<SCRIPT LANGUAGE=\"javascript\">window.open('$Status_File',
   'bottom';)</SCRIPT>";
print "</HEAD><BODY bgcolor=\"#FFFFFF\">\n";
print "</BODY></HTML>";
```

The function performed by the flow diagram of FIG. 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAS, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for notification of a first new cell, comprising:
   (A) generating a first report for a circuit design comprising a plurality of first cells including said first new cell by executing a rule check on said circuit design;
   (B) comparing said first report with a database comprising a plurality of second cells already manufactured; and
   (C) notifying a client of said first new cell in response to said first new cell not matching any of said second cells;
   (D) transferring said first report to a server inbox prior to (B).

2. The method according to claim 1, further comprising: adding said first new cell to said database.

3. The method according to claim 1, further comprising: searching said database for said first new cell prior to (C).

4. The method according to claim 3, further comprising the:
   reclassifying said first new cell as one of said second cells upon completing manufacturing of said first new cell.

5. The method according to claim 3, further comprising: removing said first new cell from said database in response to said first new cell not being manufactured.

6. The method according to claim 1 further comprising: performing a netlist-versus-layout check of said circuit design prior to transferring said first report.

7. The method according to claim 1 further comprising: performing an e-beam check of said circuit design prior to transferring said first report.

8. The method according to claim 1, further comprising: comparing a second new cell in a second report with said first new cell.

9. The method according to claim 8, further comprising: suppressing notification to said client of said second new cell in response to said second new cell duplicating said first new cell.

10. A system comprising:
   means for generating a first report for a circuit design comprising a plurality of first cells including a first new cell by executing a rule check on said circuit design;
   means for comparing said first report with a database comprising a plurality of second cells already manufactured;
   means for notifying a client of said first new cell in response to said first new cell not matching any of said second cell; and means for transferring said first report to a server inbox prior to said means for comparing.

11. A system comprising:
a first client configured to generate a first report for a circuit design comprising a plurality of first cells including a first new cell by executing a rule check on said circuit design; and
a server configured to (i) compare said first report with a database comprising a plurality of second cells already manufactured and (ii) notify a second client of said first new cell in response to said first new cell not matching at least one of said second cells.

12. The system according to claim 11, wherein said server comprises:
an inbox configured to receive said first report from said first client.

13. The system according to claim 11, wherein said database comprises:
a new database configured to store said first cells and said first new cell received from said first client.

14. The system according to claim 13, wherein said database further comprises:
a used database configured to store said second cells.

15. The system according to claim 14, wherein said database further comprises:
a canceled database configured to store a plurality of identified cells among said first cells, said second cells and said first new cell in response to a message received from said second client.

16. The system according to claim 13, wherein said server is further configure to compare a second new cell received in a second report with said first new cell stored in said new database.

17. The system according to claim 16, wherein said server is further configured to suppress notification to said second client for said second new cell in response to said second new cell matching said first new cell.

18. The system according to claim 11, wherein said server comprises:
a web server configured to allow said second client to search said database.

19. The system according to claim 18, wherein said web server is further configured to allow said second client to reclassify said first new cell as one of said second cells.

* * * * *